(12) United States Patent
Williges et al.

(10) Patent No.: US 9,789,458 B2
(45) Date of Patent: Oct. 17, 2017

(54) HIGHLY ORDERED ARRAYS OF MICELLES OR NANOPARTICLES ON A SUBSTRATE SURFACE AND METHODS FOR PRODUCING THE SAME

(71) Applicants: Max-Planck-Gesellschaft zur Foerderung der Wissenschaften e.V., Munich (DE); Ernst-Abbe-Hochschule Jena, Jena (DE)

(72) Inventors: Christian Williges, Berlin (DE); Christoph Morhard, Ludwigsburg (DE); Joachim P. Spatz, Stuttgart (DE); Robert Brunner, Jena (DE)

(73) Assignee: Max-Planck-Gesellschaft zur Foerderung der Wissenschaften e.V., Munich (DE)

( * ) Notice: Subject to any disclaimer, the term of this patent is extended or adjusted under 35 U.S.C. 154(b) by 276 days.

(21) Appl. No.: 14/401,574

(22) PCT Filed: May 15, 2013

(86) PCT No.: PCT/EP2013/001440
§ 371 (c)(1),
(2) Date: Nov. 17, 2014

(87) PCT Pub. No.: WO2013/170959
PCT Pub. Date: Nov. 21, 2013

(65) Prior Publication Data
US 2015/0141293 A1    May 21, 2015

(30) Foreign Application Priority Data
May 15, 2012   (WO) ................ PCT/EP2012/002090

(51) Int. Cl.
*B01J 19/00*   (2006.01)
*B81C 1/00*   (2006.01)
(Continued)

(52) U.S. Cl.
CPC ............ *B01J 19/0046* (2013.01); *B05D 3/06* (2013.01); *B05D 3/068* (2013.01);
(Continued)

(58) Field of Classification Search
None
See application file for complete search history.

(56) References Cited

U.S. PATENT DOCUMENTS

2010/0112234 A1   5/2010  Spatz et al.
2010/0318187 A1*  12/2010 Kruss .................. B29C 33/424
                                           623/11.11
(Continued)

FOREIGN PATENT DOCUMENTS

DE    102009060223 A1    6/2011
EP         1027157       5/1999
(Continued)

OTHER PUBLICATIONS

Cavicchi et al., "Solvent annealing thin films of poly(isoprene-b-lactide)", Polymer, vol. 46, pp. 11635-11639 (2005).
(Continued)

*Primary Examiner* — Michael Wieczorek
*Assistant Examiner* — Bradford Gates
(74) *Attorney, Agent, or Firm* — Caesar Rivise, PC

(57) ABSTRACT

The invention provides a method for increasing the order of an array of polymeric micelles or of nanoparticles on a substrate surface comprising a) providing an ordered array of micelles or nanoparticles coated with a polymer shell on a substrate surface and b) annealing the array of micelles or nanoparticles by ultrasonication in a liquid medium which is selected from the group comprising $H_2O$, a polar organic solvent and a mixture of $H_2O$ and a polar organic solvent. In a related aspect, the invention provides the highly ordered arrays of micelles or nanoparticles obtainable by the methods of the invention.

13 Claims, 3 Drawing Sheets

(51) Int. Cl.
- *C23C 18/06* (2006.01)
- *C23C 18/08* (2006.01)
- *B05D 3/06* (2006.01)
- *G03F 1/68* (2012.01)
- *B82Y 30/00* (2011.01)
- *B82Y 40/00* (2011.01)

(52) U.S. Cl.
CPC .......... *B81C 1/00031* (2013.01); *C23C 18/06* (2013.01); *C23C 18/08* (2013.01); *G03F 1/68* (2013.01); *B01J 2219/00596* (2013.01); *B81B 2207/056* (2013.01); *B81C 2201/0149* (2013.01); *B81C 2201/0198* (2013.01); *B82Y 30/00* (2013.01); *B82Y 40/00* (2013.01); *Y10T 428/24893* (2015.01)

(56) References Cited

U.S. PATENT DOCUMENTS

| | | | |
|---|---|---|---|
| 2011/0135881 A1* | 6/2011 | Burkhardt | B81C 1/00031 428/172 |
| 2012/0268823 A1 | 10/2012 | Morhard et al. | |
| 2013/0203198 A1* | 8/2013 | Min | H01L 51/428 438/46 |

FOREIGN PATENT DOCUMENTS

| | | | |
|---|---|---|---|
| EP | 2260995 A1 | 12/2010 | |
| KR | WO 2012047042 A2 * | 4/2012 | .......... H01L 51/428 |
| WO | 9921652 A2 | 5/1999 | |
| WO | 2013170959 A1 | 11/2013 | |

OTHER PUBLICATIONS

Glass et al., "Block copolymer micelle nanolithography on non-conductive substrates", New J. Phys., vol. 6 101 (2004).

Nelson et al. "Dislocation-mediated melting in two dimensions", Physical Review B, vol. 19, No. 5, pp. 2457-2484 (1979).

Terekhin et al., "Diblock Copolymer Micellar Lithography: 2. Formation of Highly Ordered Nanoparticle Ensembles with Controlled Geometric Characteristics", Colloid Journal, vol. 73, No. 5, pp. 707-716 (2011).

Yoo et al., "Single layers of diblock copolymer micelles for the fabrication of arrays of nanoparticles", J. Mater. Chem., vol. 17, pp. 2969-2975 (2007).

Zhang et al., "Fast Assembly of Ordered Block Copolymer Nanostructures through Microwave Annealing", ACS NANO, vol. 4., No. 11, pp. 7021-7029 (2010).

International Search Report for PCT/EP2013/001440 dated Jun. 27, 2013.

* cited by examiner

HIGHLY ORDERED ARRAYS OF MICELLES OR NANOPARTICLES ON A SUBSTRATE SURFACE AND METHODS FOR PRODUCING THE SAME

BACKGROUND

In recent years substrate surfaces with periodic or quasi-periodic nanostructures have found widespread use in a broad range of different applications, e.g. in the fields of optics, electronics, spectroscopy, sensor technology, lithography etc.

Especially advantageous methods for generating such nanostructures involve the use of self-assembling techniques such as block copolymer micellar nanolithography (BCML) and similar methods. In comparison with "classic" lithographic processes, self-assembling techniques are relatively simple, inexpensive, very fast and are principally suitable to provide even rather extended or 3-dimensional surfaces with the desired nanostructures.

However, in contrast to conventional lithographic methods such self-assembling techniques are more prone to the generation of structural defects. It is possible to minimize the presence of such defects by selecting suitable process conditions but it is difficult to avoid such inherent defects completely. Moreover, the interparticle distances of such structures tend to vary to a certain extent. Both structural defects and variations of the interparticle distance are very undesirable for many applications. This limits the use of self-assembling techniques for structuring surfaces in spite of the above advantages.

It is known to heal structural defects of 3-dimensional crystals by thermal annealing processes. In the course of such annealing processes, the thermal energy applied to the crystalline system results in the generation of an excited state of the system which can be re-structured and re-ordered rather easily, leading to the elimination of structural defects. The corresponding increase of the crystal lattice order obtained by these processes is largely maintained when the crystalline system returns into the ground state.

Attempts have been made to improve the degree of order of self-assembled nanostructures on a substrate surface by annealing processes as well. For this purpose, processes based on either vapour annealing (Yoo et al., J. Mater. Chem. 2007, 17, 2969-2975) or solvent annealing (Cavicchi et al., Polymer, 46, 2005, 11635-11639) were developed. The method of vapour annealing involves exposing the nano-structured substrate for several hours to an atmosphere of a specific solvent, such as THF. This method is slow and requires a rather sophisticated equipment and the use of toxic solvents. In the method of solvent annealing a thin solvent film is applied onto the substrate and subsequently evaporated in a controlled manner in a suitable atmosphere such as nitrogen. This method is only applicable for some polymers and is also quite laborious due to the required controlled evaporation. Moreover, both methods are often not suitable to achieve a very high degree of order of the nanostructures.

Thus, an object of the present invention is to provide improved methods for producing highly ordered arrays of micelles or nanoparticles on a substrate which are fast, cost-efficient and simple to perform without the need of expensive equipment.

A further object is to provide large and very highly ordered arrays of micelles or nanoparticles on a substrate surface.

Said objects are achieved according to the present invention by providing novel methods for producing highly ordered arrays of micelles or nanoparticles on a substrate which involve an annealing step by ultrasonication in a polar liquid medium and by providing the highly ordered array of micelles or nanoparticles according to the invention.

Description of the Invention

The method for increasing the order of an array of polymeric micelles or of nanoparticles on a substrate surface according to the invention comprises at least the following steps.

a) providing an ordered array of micelles or nanoparticles coated with a polymer shell on a substrate surface and b) annealing the array of micelles or nanoparticles by ultrasonication in a liquid medium which is selected from the group comprising $H_2O$, a polar organic solvent and a mixture of $H_2O$ and a polar organic solvent.

In a more specific embodiment, the method according to the present invention comprises the following steps a) providing an ordered array of polymeric micelles loaded with at least one metal salt on a substrate surface, b) annealing the array of micelles or nanoparticles by ultrasonication in a liquid medium which is selected from the group comprising $H_2O$, a polar organic solvent and a mixture of $H_2O$ and a polar organic solvent, and c) converting the at least one metal salt in said micelles by an oxidation or reduction treatment into inorganic nanoparticles and optionally partial or complete removal of the organic copolymer of the micelles by a plasma treatment.

The substrate surface to be coated may be any substrate capable to be coated with the polymeric micelles or nanoparticles coated with a polymer shell. Some non-limiting examples are glasses, Si, $SiO_2$, ZnO, $TiO_2$, $Al_2O_3$, C, InP, GaAs, GaP, GaInP, AlGaAs.

In a preferred embodiment of the method of the invention, the ordered array of micelles is a hexagonal array produced by a block copolymer micellar nanolithography (BCML) technique.

In the micellar nanolithography (see, e.g., EP 1 027 157) a micellar solution of a diblock- or multiblock copolymer is deposited onto a substrate, e.g., by immersion coating, and, given suitable conditions on the surface, forms an ordered film structure of chemically different polymer domains, depending, i.a., on the type, molecular weight and concentration of the block copolymer. For example, the distances of the individual polymer domains from each other are a function of the molecular weight and the concentration of the block polymer in the solution. The micelles in the solution can be charged with inorganic salts or acids that can be reduced to inorganic nanoparticles after the deposition with the polymer film.

Basically any micelle-forming block copolymer can be used as two-block or multi-block copolymer in this method that can be deposited as a film onto a substrate and that forms an ordered structure of different polymer domains. Suitable block copolymers are, for example, all block copolymers mentioned in the above-cited EP 1 027 157. In a more specific embodiment, the two-block- or multi-block copolymer is selected from the group of polystyrene (n)-b-poly (2-vinylpyridine (m), polystyrene (n)-b-poly (4-vinylpyridine (m), polystyrene (n)-b-poly (ethylene oxide) (m), in which n and m indicate the number of repetition units and are, independently of one another, integers in the range of 10-10,000, in particular 100-1000. The molecular weight (Mw) (dissolved block) is preferably selected >>Mw (poorly dissolved block).

Basically all inorganic metal compounds (e.g., metallic salts) that can be converted by oxidation or reduction into inorganic nanoparticles are suitable as inorganic compounds with which the micelles in the solution and the polymer domains in the deposited plastic film, respectively, can be charged. Suitable salts are, for example, all metallic salts mentioned in the above-cited EP 1 027 157. The metallic salts used in accordance with the invention preferably comprise at least one salt of the metals Au, Pt, Pd, Ag, In, Fe, Zr, Al, Co, Ni, Ga, Sn, Zn, Ti, Si or Ge. $HAuCl_4$ is especially preferred.

The nanoparticles coated with a polymer shell are preferably selected from the group comprising metals, such as Au, Ag, Pd, Pt, Cu, Ni and mixtures thereof, metal oxides such as $Al_2O_3$, $Fe_2O_3$, $Cu_2O$, $TiO_2$, $SiO_2$, Si or other semiconductors.

The polymer shell may comprise any polymer suitable for the desired purpose. Some specific, non-limiting examples are polymers selected from the group comprising polystyrene, polypyridine, polyolefines including polydienes, PMMA and other poly(meth)acrylates, and blends or copolymers thereof.

In a preferred embodiment, the shell-forming polymer has a terminal anchoring group with a high affinity to the surface of the nanoparticles. The term "anchoring group having a high affinity to the surface of the nanoparticles", as used herein, includes anchoring groups capable to form a covalent bond (or a bond with a strong covalent character) with molecules of the nanoparticles or functional groups thereon. Typically, the functional anchoring group is a thiol, amine, COOH, ester or phosphine group.

The annealing of nanostructures on a substrate surface according to the present invention is effected by means of ultrasonication in a liquid medium, preferably a polar liquid medium. More specifically, said liquid medium is selected from the group comprising $H_2O$, a polar organic solvent and a mixture of $H_2O$ and a polar organic solvent.

Preferably, the liquid medium comprises or consists of a $C_1$-$C_{10}$ alkanol, in particular methanol, ethanol, propanol and butanol, or a mixture of $H_2O$ and a $C_1$-$C_{10}$ alkanol, in particular methanol, ethanol, propanol and butanol.

In a more preferred embodiment, the solvent consists of ethanol or of a mixture of $H_2O$ and ethanol in a ratio in the range from 2:1 to 0.01:1, preferably in a ratio of about 1:2.

Typically, the ultrasonication is effected at a frequency in the range of 20 kHz-2 MHz, preferably from 30 kHz to 1 or 2 MHz or from 1 MHz to 2 MHz, and a power input in the range of 5 W/l to 50 W/l, preferably from 15 W/l to 30 W/l.

Contrary to annealing methods of the prior art, excellent results are obtained in a rather short time. Typically, the ultrasonication is effected for a time period in the range of from 10 to 500 s, preferably 30-200 s, such as 50-150 s.

The ultrasonication can be effected over a broad temperature range from 15° C. to 70° C., more specifically 18-50° C. or 18° C.-40° C., but it is convenient and usually sufficient to use a temperature near room temperature, such as a temperature in the range from 20° C. to 30° C., preferably from 20° C. to 25° C.

In the method according to the present invention, said ultrasonication treatment typically results in at least 10% increase of the order of the array of micelles or nanoparticles as indicated by a corresponding decrease of the standard deviation of the mean intermicelle or interparticle distance. If the array of micelles or nanoparticles initially provided has an especially low degree of order, the increase of order achieved by the method of the invention may be even higher.

It should be recognized that the method of the invention may also be applied advantageously to eliminate local structural defects of an extended array of micelles or nanoparticles which exhibits an overall relatively high degree of order.

Thus, even if the overall order of the array of micelles or nanoparticles is not increased considerably by the method of the invention, the elimination of local defects may still represent an essential improvement of the nanostructured substrate in order to qualify for a number of applications.

In a specific embodiment of the invention, the array of micelles or nanoparticles is provided in the interspaces of larger primary structures. Typically, these primary structures have mean distances in the range from to 25 nm to 10 μm, preferably in the range from 25 nm to 500 nm, 30 nm to 500 nm, or 50 nm to 500 nm, and are produced by "classical" lithographic methods such as optical, UV, or deep-UV (mask-based) lithography, direct-writing techniques, electron-beam lithography or nano-Imprint techniques. These prestructured substrates can be used in the method of the invention as outlined above.

A closely related aspect of the present invention are the very highly ordered arrays of micelles or nanoparticles obtainable with the above methods.

Typically, such ordered arrays of micelles or nanoparticles, in particular inorganic nanoparticles, on a substrate surface have a mean distance of micelles or particles in the range from 5 nm to 250 nm, preferably 5-100 nm or 25-250 nm, and a standard deviation of the mean value of less than 10%, preferably less than 5%, such as 1-3%.

If the ordered arrays of micelles or nanoparticles are provided in the interspaces of larger primary structures, the mean distance of said micelles or particles will be markedly smaller than the mean distance of the respective primary structures, typically in the range from 10-50 nm, 5-50 nm, 5-25 nm, 5-20 nm or 5-10 nm.

The highly ordered arrays of micelles or nanoparticles obtainable by the methods of the present invention are of interest for a wide variety of applications, in particular in the fields of optics, electronics, spectroscopy, sensor technology, imaging technology, biochips, data storing and processing, lithography.

Thus, a further aspect of the invention relates to a device, in particular an optic device, spectroscopic device or sensor device, a mask, in particular a lithographic mask or photo mask, a biochip, a tool for a replication process, a transistor, an integrated circuit, a processor, or a memory-device, comprising said highly ordered arrays.

A further, closely related aspect of the invention relates to the use of these highly ordered arrays for manufacturing a device which is selected from the group comprising a mask, in particular a lithographic mask or photo mask, a biochip, a tool for a replication process, a sensor, an optical device or a transistor, an integrated circuit, a processor, or a memory-device.

BRIEF DESCRIPTION OF THE FIGURES

Increase of the degree of order of the micellar array; (B) Decrease of the standard deviation of the mean distance of the micellar array

The present invention is illustrated in more detail in the following non-limiting examples.

EXAMPLE 1

Preparation of Highly Ordered Arrays of Micelles on a Substrate Surface

Arrays of gold-salt loaded micelles on a glass substrate were prepared by micellar block copolymer nanolithography essentially according to published methods (e.g. EP 1 027 157).

As an initial step, a 5 mg/ml toluene solution of micelles of the diblock copolymer polystyrene-block-polyvinylpyridine (PS-b-P2VP; Mn(PS) 190.000; Mn (P2VP) 55.000; Mw/Mn=1.10) loaded with $HAuCl_4$ was prepared and stored in a sealed glass vial.

This micellar solution was applied on a glass substrate (24 mm×24 mm) by spin coating (6000 rpm, 1 min) in a spin coater (WS-400B, Laurell Technologies, North Wales, USA) and left drying.

The conditions were adjusted so that a sample with a mean micelle distance of 68-72 nm and a standard deviation of the mean distance value in range of 9-13 nm was obtained. If desired, it is possible to decrease the initial degree of order by adding ultra pure $H_2O$ to the above polymer solution (e.g. 1 vol. %).

The resulting nanostructured sample was placed in a commercial sonifier (Sanorex, Bandelion electronic, Berlin) and immersed in a liquid medium consisting of a mixture of ethanol:$H_2O$ in different ratios at room temperature and sonicated at a frequency of 35 kHz and a power input in the range of 5-50 W/l, preferably 15-30 W/l, for 120 s.

Figure 1:
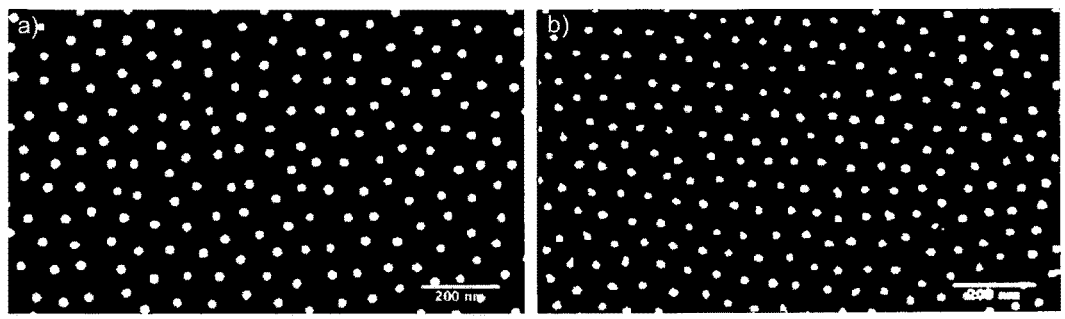
FIG. 1 shows SEM micrographs of a substrate surface structured with gold nanoparticles (in order to show the order more clearly the individual particles have been masked with white circles): (A) before annealing; B) after annealing
Figure 2:
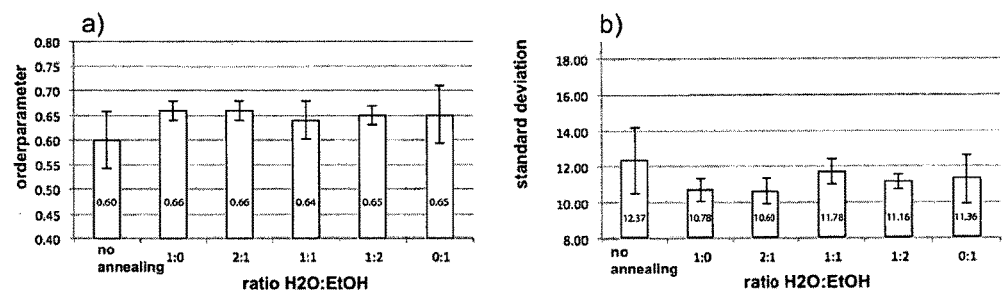
FIG. 2 shows the results of an ultrasound annealing treatment of a micellar array with varying solvent ratios: (A)

FIG. 2 shows the results of this ultrasound annealing treatment with different solvent ratios. These diagrams were obtained by image processing of corresponding SEM micrographs. The data are derived from 14 measuring points (7 different positions on 2 identically treated samples).

The degree of order as used herein is indicated by the "sixfold bond-orientational order parameter" $\psi_6$ as defined by D. Nelson and B. I. Halperin in *Physical Review* B 19.5 (1979), 2457-2484, for a hexagonal array.

$$\psi_6 = \left| \frac{1}{N_{bonds}} \sum_j \sum_k e^{i \cdot 6 \cdot \theta_{jk}} \right|$$

with $N_{bonds}$=number of connections between the central particle of a hexagon and its next neighbors; $\theta_{jk}$=angle between a central particle and 2 next neighbors in juxtaposition, k=central particle and j=neighbor.

For an ideal structure exclusively consisting of perfect hexagons, the order parameter $\psi_6=1$.

A high order parameter corresponds to a low standard deviation of the interparticle distance, both values are largely inverse proportional to each other. Thus, for a more simple indication of the order of a nanostructured array, often the standard deviation of the interparticle or intermicelle distance is used herein.

As evident from FIG. 2, a marked increase of the degree of order of the micellar array and a corresponding decrease of the standard deviation of the mean distance of the micellar array is observed in each case. The influence of the specific solvent ratio is rather low.

In order to assess the influence of the duration of the annealing treatment, a micellar array was prepared as indicated above and ultrasonicated for different time periods with an ethanol: $H_2O$ ratio of 2:1.

Figure 4:
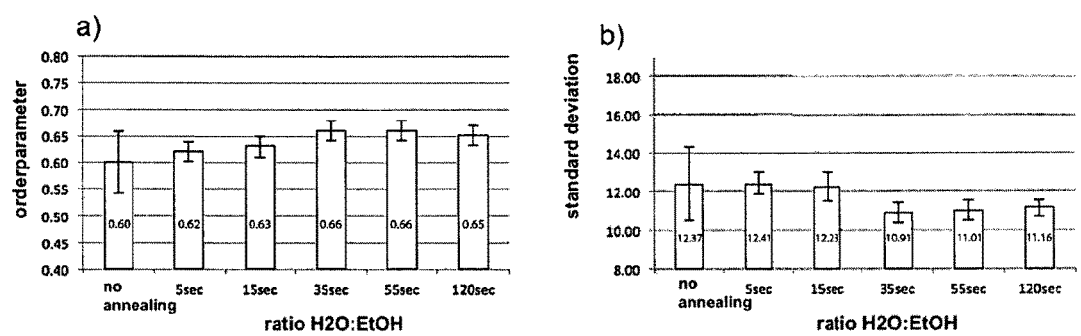
FIG. 4 shows the results of an ultrasound annealing treatment of a micellar array with a solvent ratio ethanol: $H_2O=2:1$ and varying duration of the annealing treatment: (A) Increase of the degree of order of the micellar array; (B) Decrease of the standard deviation of the mean distance of the micellar array
Figure 5:
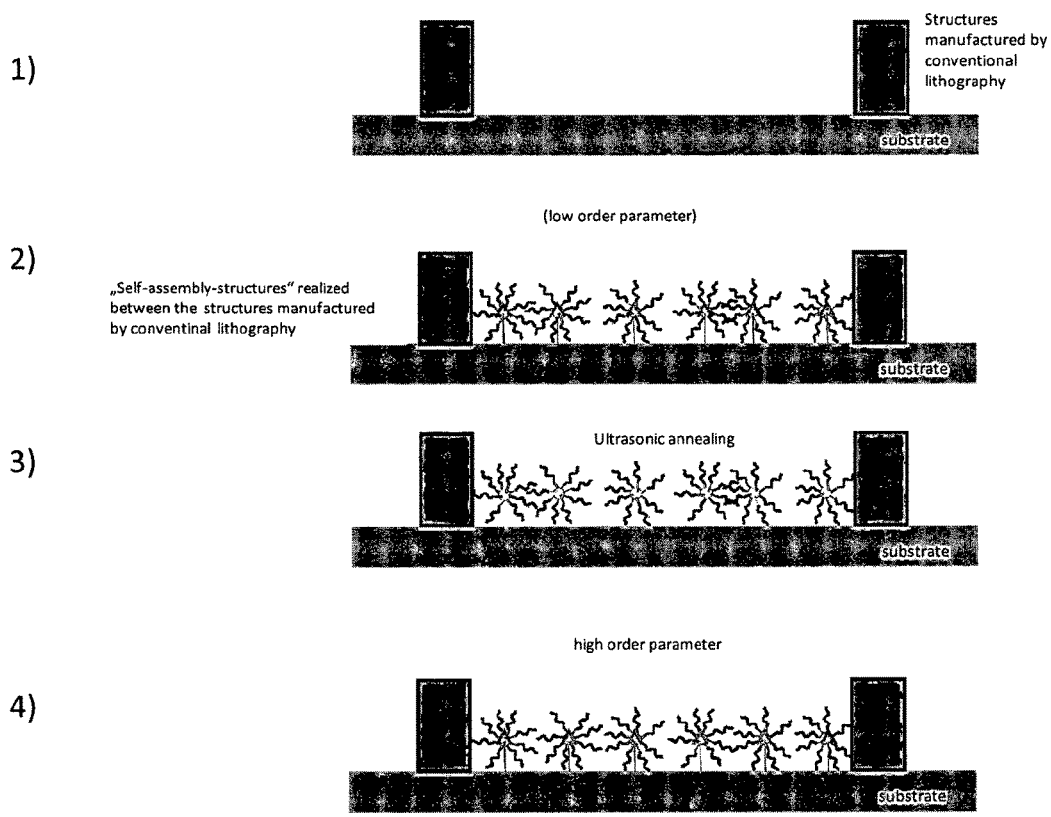
FIG. 5 shows schematically a specific embodiment of the invention, wherein the array of micelles or nanoparticles is provided in the interspaces of larger primary structures.

FIG. 4 shows that a rather short annealing time of about 35-55 s already provides excellent results with respect to the increased degree of order of the micellar array and a corresponding decrease of the standard deviation of the mean distance of the micellar array. Considerable longer annealing times resulted in rather marginal improvements.

EXAMPLE 2

Preparation of Highly Ordered Arrays of Nanoparticles on a Substrate Surface

A micellar array was prepared on a glass substrate and subjected to an ultrasound annealing treatment with varying solvent ratios analogous to Example 1.

The resulting micellar array was subjected to a plasma treatment essentially according to published methods (e.g. EP 027 157). Typically, the substrate was treated with W10 plasma (90 vol. % argon and 10 vol. % hydrogen) at a pressure of 0.4 mbar for 45 minutes and 150 W power input in a PlasmaSystem 100 (PVA TePla, Wettenberg, Germany) device.

In the course of this process, the polymer shell of said micelles was removed and the gold salt contained therein was reduced to elemental gold, whereby a highly ordered array of gold nanoparticles was obtained.

Figure 3:
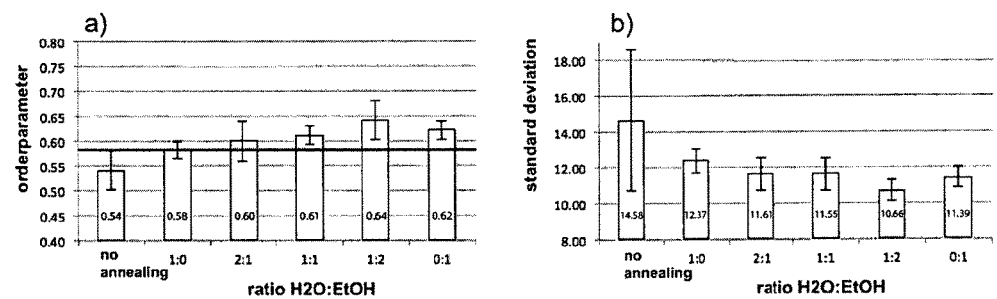
FIG. 3 shows the results of an ultrasound annealing treatment of a micellar array with varying solvent ratios and subsequent plasma treatment to obtain a corresponding gold nanoparticle array; (A) Increase of the degree of order of the nanoparticle array; (B) Decrease of the standard deviation of the mean distance of the nanoparticle array

FIG. 3 shows the results of the preceding ultrasound annealing treatment with different solvent ratios. These diagrams were obtained by image processing of corresponding SEM micrographs. The data are derived from 14 measuring points (7 different positions on 2 identically treated samples).

The plasma treatment results in a slightly lower degree of order as compared with the initial micellar array and a corresponding increase of the standard deviation of the mean interparticle distance to about 14.5 nm for the non-annealed sample.

A considerable increase of the degree of order of the nanoparticle array and a corresponding decrease of the standard deviation of the mean distance of the nanoparticle array was observed for each solvent ratio. In this case, however, a strong influence of the specific solvent ratio is evident. Best results were obtained with an ethanol:$H_2O$ ratio of 2:1.

The invention claimed is:

1. A method for increasing an order of an array of polymeric micelles or of nanoparticles on a substrate surface comprising:
   a) providing an ordered array of micelles or nanoparticles coated with a polymer shell on a substrate surface, and
   b) annealing the array of micelles or nanoparticles by ultrasonication in a liquid medium which comprises a $C_1$-$C_{10}$ alkanol or a mixture of $H_2O$ and the $C_1$-$C_{10}$ alkanol, wherein the ultrasonication is effected at a frequency in a range of 20 kHz to 2 MHz, a power input in a range of 5 W/l to 50 W/l, and a temperature in a range from 15° C. to 70° C.

2. The method according to claim 1, wherein the liquid medium consists of ethanol or of a mixture of $H_2O$ and ethanol in a ratio in a range from 2:1 to 0.01:1.

3. The method according to claim 1, wherein the ultrasonication is effected for a time period in a range of 10 to 500 s.

4. The method according to claim 1, wherein the ordered array of micelles is a hexagonal array produced by a block copolymer micellar nanolithography (BCML) technique.

5. The method according to claim 1, wherein the substrate is a member selected from the group consisting of glasses, Si, $SiO_2$, ZnO, $TiO_2$, $Al_2O_3$, C, InP, GaAs, GaP, GaInP, and AlGaAs.

6. The method according to claim 1, wherein the micelles are micelles of a two-block- or multi-block copolymer selected from the group consisting of polystyrene (n)-b-poly (2-vinylpyridine (m), polystyrene (n)-b-poly (4-vinylpyridine (m), and polystyrene (n)-b-poly (ethylene oxide) (m), in which n and m indicate a number of repetition units and are, independently of one another, integers in a range of 10-10,000.

7. The method according to claim 1, wherein the nanoparticles coated with a polymer shell are metals, metal oxides or semiconductors.

8. The method according to claim 1, wherein the micelles are loaded with at least one metal salt.

9. The method according to claim 8, wherein the at least one metal salt is a member selected from the group consisting of salts of Au, Ag, Pd, Pt, In, Fe, Zr, Al, Co, Ni, Ga, Sn, Zn, Ti, Si and Ge.

10. The method according to claim 8, further comprising the following step:
   c) converting the at least one metal salt in said micelles by an oxidation or reduction treatment into inorganic nanoparticles and optionally partial or complete removal of an organic copolymer of the micelles by a plasma treatment.

11. The method according to claim 1, wherein the ultrasonication treatment results in an at least 10% increase of an order of the array of micelles or nanoparticles as indicated by a corresponding decrease of a standard deviation of a mean intermicelle or interparticle distance.

12. The method according to claim 1, wherein the substrate surface is prestructured with primary structures having mean distances in a range from to 25 nm to 10 µm, and the ordered array of micelles or inorganic nanoparticles is provided in an interspace between the primary structures.

13. The method according to claim 12, wherein the primary structures having mean distances in the range from to 25 nm to 10 µm are formed on the substrate surface by optical lithography, UV lithography, deep-UV lithography, laser lithography, electron-beam lithography or nano-Imprint techniques.

* * * * *